United States Patent
Van Houdt (10) Patent No.: US 11,296,117 B2
(45) Date of Patent: Apr. 5, 2022

(54) THREE-DIMENSIONAL FERROELECTRIC MEMORY

(71) Applicant: IMEC vzw, Leuven (BE)

(72) Inventor: Jan Van Houdt, Bekkevoort (BE)

(73) Assignee: IMEC vzw, Leuven (BE)

(*) Notice: Subject to any disclaimer, the term of this patent is extended or adjusted under 35 U.S.C. 154(b) by 0 days.

(21) Appl. No.: 17/112,475

(22) Filed: Dec. 4, 2020

(65) Prior Publication Data

US 2021/0175254 A1    Jun. 10, 2021

(30) Foreign Application Priority Data

Dec. 6, 2019  (EP) .................................... 19214058

(51) Int. Cl.
*H01L 27/11597*    (2017.01)
*H01L 27/1159*    (2017.01)
(Continued)

(52) U.S. Cl.
CPC .... *H01L 27/11597* (2013.01); *H01L 27/1158* (2013.01); *H01L 27/1159* (2013.01); *H01L 27/11578* (2013.01); *H01L 27/11585* (2013.01)

(58) Field of Classification Search
CPC ........... H01L 27/11578; H01L 27/1158; H01L 27/11585; H01L 27/1159; H01L 27/11597
See application file for complete search history.

(56) References Cited

U.S. PATENT DOCUMENTS 6,853,575 B2    2/2005  Kang
7,221,588 B2 *  5/2007  Fasoli .................... G11C 16/04
                                                     257/314
(Continued)

FOREIGN PATENT DOCUMENTS

JP    2001-024163 A    1/2001
WO    WO 2018/136734 A1    7/2018

OTHER PUBLICATIONS

Florent et al., "First Demonstration of Vertically Stacked Ferroelectric Al Doped HfO2 Devices for NAND Applications", 2017 Symposium on VLSI Technology Digest of Technical Papers, JSAP, Jun. 5, 2017, pp. T158-T159.
(Continued)

*Primary Examiner* — Matthew E Warren
(74) *Attorney, Agent, or Firm* — Knobbe, Martens, Olson & Bear, LLP (57) ABSTRACT

The disclosed technology relates generally to semiconductor memory devices, and more particularly to three-dimensional (3D) ferroelectric memory devices, methods of fabricating 3D ferroelectric memory devices, and methods of conditioning 3D ferroelectric memory devices. The 3D ferroelectric memory device exploits programmed memory cells as selector devices. In one aspect, a 3D ferroelectric memory device comprises a stack comprising a plurality of gate electrode layers and spacer layers, which are alternatingly arranged. The 3D ferroelectric memory device additionally comprises a semiconductor channel extending through the stack and a ferroelectric layer arranged between the gate electrode layers and the semiconductor channel. The gate electrode layers form, in combination with the channel and the ferroelectric layer, a string of ferroelectric transistors, wherein each ferroelectric transistor is associated with one cell of the memory device. The first ferroelectric transistor and the last ferroelectric transistor in the string have a lower threshold voltage than the other ferroelectric transistors.

20 Claims, 5 Drawing Sheets

(51) Int. Cl.
*H01L 27/11585* (2017.01)
*H01L 27/11578* (2017.01)
*H01L 27/1158* (2017.01)

(56) References Cited

U.S. PATENT DOCUMENTS

| | | | |
|---|---|---|---|
| 7,233,522 B2* | 6/2007 | Chen | G11C 16/0483 |
| | | | 257/E21.663 |
| 9,530,824 B2 | 12/2016 | Takaki et al. | |
| 2005/0128807 A1 | 6/2005 | Chen et al. | |
| 2012/0275234 A1* | 11/2012 | Lee | G11C 16/14 |
| | | | 365/185.23 |
| 2016/0055911 A1 | 2/2016 | Nguyen et al. | |
| 2016/0118404 A1* | 4/2016 | Peng | H01L 27/1159 |
| | | | 257/295 |
| 2017/0365349 A1* | 12/2017 | Pang | G11C 16/26 |
| 2019/0189216 A1 | 6/2019 | Baek et al. | |
| 2019/0304988 A1 | 10/2019 | Dong et al. | |

OTHER PUBLICATIONS

Higashi et al., "New Insights into the Imprint Effect in Fe—$HfO_2$ and its Recovery", 2019 IEEE International Reliability Physics Symposium (IRPS), IEEE, Mar. 31, 2019, 4 pages.

Seidel et al., Gate Stack Optimization Toward Disturb-Free Operation of Ferroelectric HSO based FeFET for NAND Applications, 2019 $19^{th}$ Non-Volatile Memory Technology Symposium (NVMTS), IEEE, Oct. 28, 2019, 2 pages.

Extended European Search Report dated May 12, 2020 in counterpart European Application No. 19214058.0 in 11 pages.

* cited by examiner

THREE-DIMENSIONAL FERROELECTRIC MEMORY

CROSS-REFERENCE TO RELATED APPLICATIONS

This application claims foreign priority to European Application No. EP 19214058.0, filed Dec. 6, 2019, the content of which is incorporated by reference herein in its entirety.

BACKGROUND

Field

The disclosed technology relates generally to semiconductor memory devices, and more particularly to three-dimensional (3D) ferroelectric memory devices, methods of fabricating 3D ferroelectric memory devices, and methods of conditioning 3D ferroelectric memory devices.

Description of the Related Technology

Figure 5:
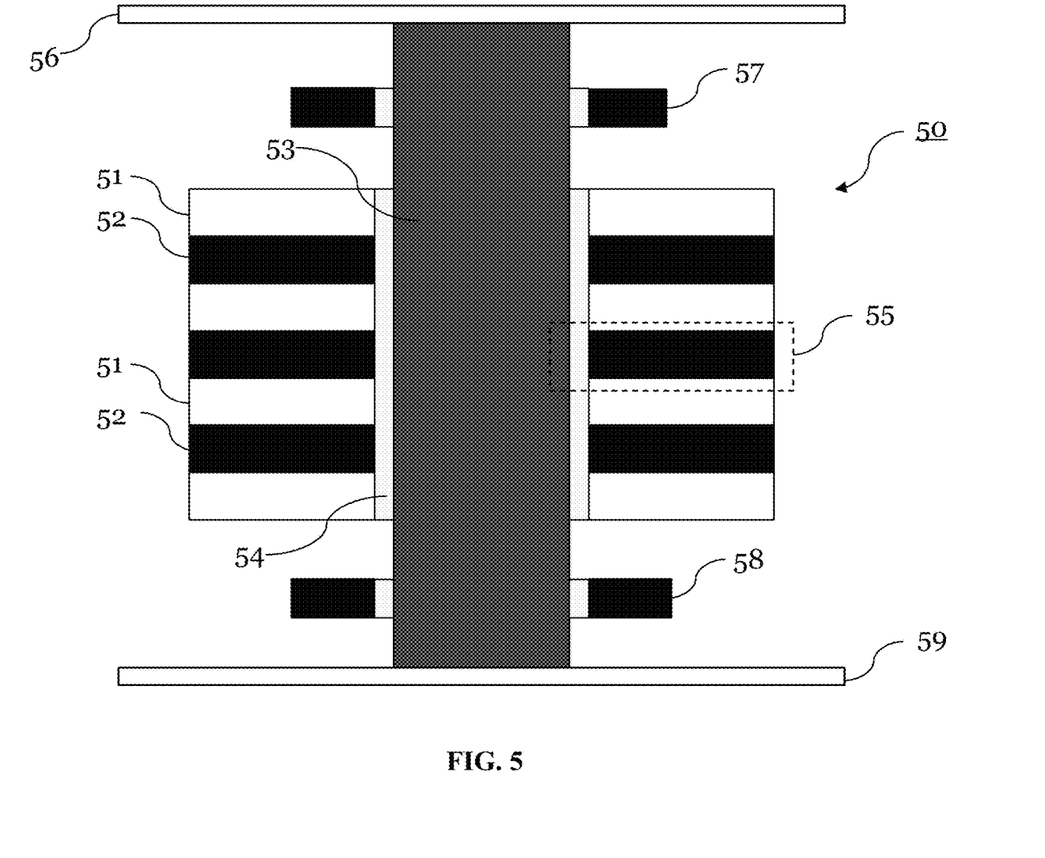
FIG. 5 shows a 3D memory device.

In a conventional 3D memory device, e.g., a NAND-type 3D memory device 50 illustrated in FIG. 5, each memory cell is associated with a transistor 55, which is formed by a channel 53, a gate electrode layer 52, and a dielectric layer 54 arranged between the gate electrode layer 52 and the channel 53. The transistors 55 (also corresponding to the memory cells) are arranged vertically on top of each other along the channel 53, and thus form a string of transistors 55. Multiple strings of transistors 55 may be arranged on a single chip of the memory device 50, in order to increase the memory density. However, to separately address the different strings, and to avoid sneak currents between the different strings, selectors are used. In particular, a selector 57 is required on the bit-line 56 (referred to as "bit-line selector"), and a selector 58 is required on the source-line 59 (referred to as "source-line selector").

The problem with such selectors 57, 58 is, that they complicate the process flow of fabricating the conventional 3D memory device 50. Indeed, while all transistors 55 in a string of transistors 55 may be processed in one process sequence, the selectors 57, 58 may be processed in a separate process, because they require different gate stacks. One of the major reason for this is that using the same gate stack in the selectors 57, 58, as in the transistors 55 associated with the memory cells, could lead to unwanted programming of the selectors 57, 58, which would eventually lead to failure in read and/or write. This is due to the fact that charge based memories, such as Flash memories, use positive voltages on the selectors 57, 58, and these voltages can disturb the threshold voltage in the positive direction, i.e. towards cut-off.

Furthermore, not only is the fabrication process complicated significantly, but the selectors 57, 58 also require a considerable amount of space in the conventional memory device 50, so that decreasing the memory devices size is difficult.

SUMMARY OF CERTAIN INVENTIVE ASPECTS

In view of the above-mentioned disadvantages, embodiments of the present invention aim to provide an improved 3D memory device, which can be implemented as a NAND-type memory device, and improved methods for obtaining such 3D memory device. An objective is to simplify the fabrication process. In particular, a process for creating the memory cells and selectors of the 3D memory device should be similar. Another goal is to decrease the size or increase the density of the 3D memory device. Thereby, a performance of the 3D memory device should be improved, or should at least be the same, as of a conventional 3D memory device.

The objective is achieved by the embodiments of the invention provided in the enclosed independent claims. Advantageous implementations of these embodiments are defined in the dependent claims.

In particular, the embodiments of the invention base on ferroelectric memory cells, and conditioning, post-fabrication and prior to use, some of these memory cells to function as selectors.

A first aspect of the invention provides a method for fabricating a 3D ferroelectric memory device, wherein the method comprises: forming a stack comprising a plurality of gate electrode layers and spacer layers, which are alternatingly arranged one on the other along a first direction; forming a semiconductor channel extending in the stack; forming a ferroelectric layer between the gate electrode layers and the semiconductor channel; wherein the gate electrode layers form, in combination with the channel and the ferroelectric layer, a string of ferroelectric transistors, wherein each ferroelectric transistor is associated with one cell of the memory device, and wherein the method further comprises: conditioning the first ferroelectric transistor and the last ferroelectric transistor in the string to decrease their respective threshold voltages.

By using ferroelectric memory cells, i.e., by fabricating ferroelectric transistors, to form the string of transistors, the first transistor and the last transistor in the string can be conditioned (programmed) to work, respectively, as a selectors. This is due to the fact that the conditioning can decrease the threshold voltage of the respective ferroelectric transistors, so that these ferroelectric transistors are always in the on-state when the memory device is operated. Indeed, selecting a string during operation of the memory device with such selectors may push the threshold voltage down each time. At the same time, the well-known imprint effect in the ferroelectric materials of the conditioned memory cell, helps to preserve the lowered threshold voltages of the first and last ferroelectric transistor, and prevents the threshold voltages from moving away from their conditioned/programmed value. The major advantage of the method of the first aspect is, that all memory cells, i.e. all gate stacks of the different ferroelectric transistors, can be processed together, i.e. including the transistors later functioning as the selectors at both sides of the string. This results in a huge saving in process cost and complexity, and also removes the need for separate selectors and the space they require in the memory device.

The method may include fabricating multiple of the above-mentioned channels and corresponding strings of transistors. Each string of transistors may be a different NAND string in the memory device, if of the NAND-type. The selectors of the different strings allow selecting the strings, as in a conventional 3D memory device.

Forming a layer "on" another layer means that these two layers are adjacent, i.e., touch each other. Forming, e.g. the gate electrode layers and spacer layers, "one on the other" means that those are adjacently formed layers along a certain directions. For instance, they may be arranged along the vertical directions, in which case they are arranged "one above the other", In an implementation of the method, the conditioning of the first and the last ferroelectric transistor comprises applying a positive voltage to their respective gate electrode layers.

The positive voltage on the gates (gate electrode layers) of these transistors, being programmed as selectors, tends to decrease their respective threshold voltages, which may guarantee their on-state throughout the lifetime of the memory device.

In an implementation of the method, the ferroelectric transistors are all formed in the same process.

This hugely simplifies the method for fabricating the 3D ferroelectric memory device.

In an implementation of the method, before conditioning the first and the last ferroelectric transistor, all the ferroelectric transistors have the same threshold voltage.

Accordingly, after conditioning of the first and the last ferroelectric transistor, respectively, these conditioned ferroelectric transistors have a higher threshold voltage, and all other ferroelectric transistors in the string of ferroelectric transistors have a higher threshold voltage.

In an implementation of the method, the conditioning of the first and the last ferroelectric transistor is performed by applying a test mode or test pattern.

That is, the conditioning of the ferroelectric transistors can be conveniently done before the 3D ferroelectric memory device is packaged.

In an implementation of the method, the conditioning of the first and the last ferroelectric transistor comprises decreasing their respective threshold voltages to a value that guarantees their on-state during operation of the memory device.

In an implementation of the method, the conditioning of the first and the last ferroelectric transistor comprises setting their threshold voltages to a common predetermined value or to different predetermined values.

A second aspect of the invention provides a 3D ferroelectric memory device, comprising: a stack comprising a plurality of gate electrode layers and spacer layers, which are alternatingly arranged one on the other along a first direction; a semiconductor channel extending in the stack; a ferroelectric layer arranged between the gate electrode layers and the semiconductor channel; wherein the gate electrode layer form, in combination with the channel and the ferroelectric layer, a string of ferroelectric transistors, wherein each ferroelectric transistor is associated with one cell of the memory device, and wherein the first ferroelectric transistor and the last ferroelectric transistor in the string have a lower threshold voltage than the other ferroelectric transistors.

The first and the last ferroelectric transistor may be conditioned as described above with respect to the method of the first aspect. They may accordingly form conditioned memory cells acting as selectors. Thus, the 3D ferroelectric memory device of the second aspect is much easier to process than a conventional memory device. Further, due to removed additional selectors, it can be built smaller.

The 3D ferroelectric memory device may comprise multiple of the above-described strings of ferroelectric transistors (memory cells), wherein each string has a conditioned ferroelectric transistor at the beginning and the end of the string. Thus, selectors are provided without forming any structures separate from the memory cells (which may be formed in the same process).

In an implementation of the 3D ferroelectric memory device, a bit-line and a source-line of the memory device are directly connected to, respectively, the first ferroelectric transistor and the last ferroelectric transistor.

That means, there are no separate selectors, which allows reducing the size of the memory device.

In an implementation of the 3D ferroelectric memory device, the first ferroelectric transistor is configured to be a bit-line selector during operation of the memory device, and/or the last ferroelectric transistor is configured to be a source-line selector during operation of the memory device.

In an implementation of the 3D ferroelectric memory device, the first ferroelectric transistor and the last ferroelectric transistor are, respectively, configured to be always in the on-state during operation of the memory device.

In an implementation of the 3D ferroelectric memory device, the semiconductor channel is a macaroni channel filled with a dielectric material and surrounded by the ferroelectric layer.

The channel may also be a full channel, e.g., (non-filled) semiconductor channel material surrounded by the ferroelectric layer.

In an implementation of the 3D ferroelectric memory device, the ferroelectric transistors are connected in series to form a memory cell NAND string.

A third aspect of the invention provides a method for conditioning a 3D ferroelectric memory device, wherein the memory device comprises: a stack comprising a plurality of gate electrode layers and spacer layers, which are alternatingly arranged one on the other along a first direction; a semiconductor channel extending in the stack; a ferroelectric layer arranged between the gate electrode layers and the semiconductor channel; wherein the gate electrode layers form, in combination with the channel and the ferroelectric layer, a string of ferroelectric transistors, wherein each ferroelectric transistor is associated with one cell of the memory device; wherein each ferroelectric transistor has the same threshold voltage, and wherein the method comprises: conditioning the first ferroelectric transistor and the last ferroelectric transistor in the string, in order to decrease their respective threshold voltages.

The method of the third aspect has the advantage, that a 3D ferroelectric memory device can be fabricated, wherein the 3D ferroelectric memory device has no separate selectors. That is, the bit-line and/or source-line may be connected directly (without separate selector in between) to the first and the last ferroelectric transistor, respectively. These first and last ferroelectric transistors may then be conditioned to function as selectors in the final memory device.

BRIEF DESCRIPTION OF THE DRAWINGS

The above described aspects and implementations are explained in the following description of embodiments with respect to the enclosed drawings.

DETAILED DESCRIPTION OF CERTAIN ILLUSTRATIVE EMBODIMENTS

The disclosed technology is directed to a three-dimensional (3D) ferroelectric memory device, which can be configured as a NAND-type memory. Embodiments are directed to a 3D ferroelectric memory device, a method for fabricating a 3D ferroelectric memory device, and a method for conditioning a 3D ferroelectric memory device. The 3D ferroelectric memory device according to embodiments exploits programmed memory cells usable as bit-line and/or source-line selectors.

Figure 1A:
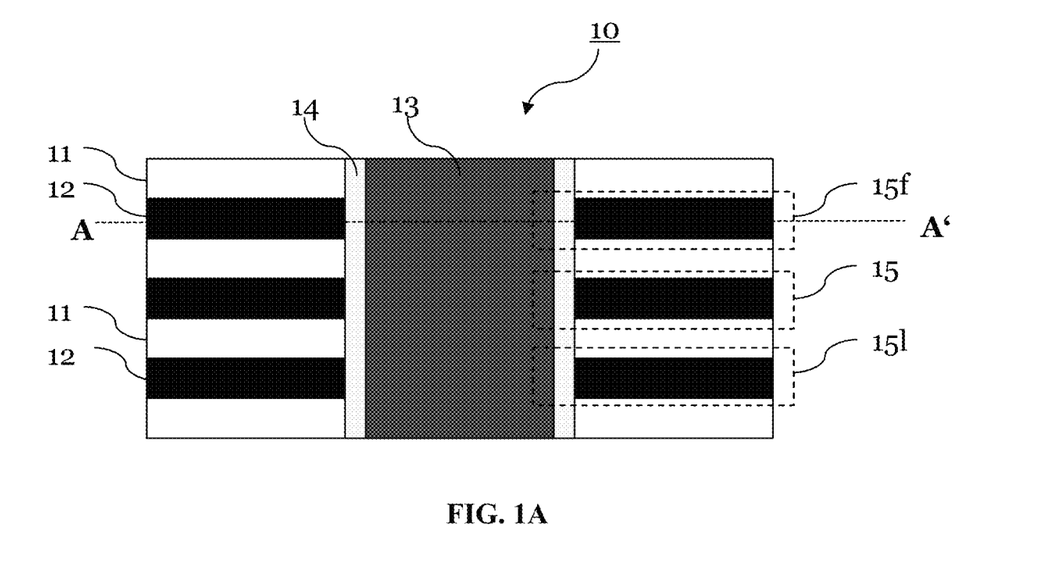
FIG. 1A shows a cross-sectional side view of a three dimensional (3D) ferroelectric memory device having a straight channel, according to embodiments.
Figure 1B:
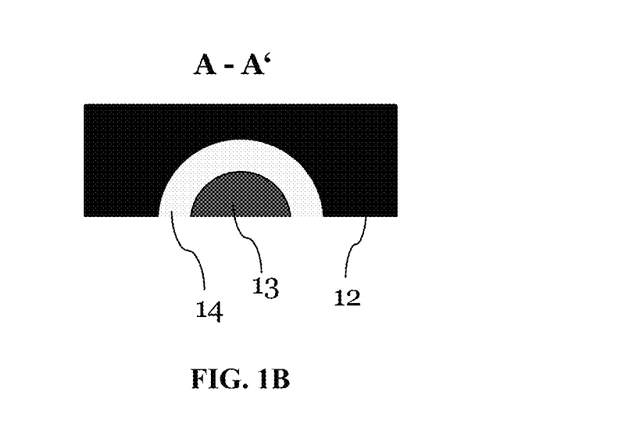
FIG. 1B shows a top view of the 3D ferroelectric memory device shown in FIG. 1A at a cross-section through A-A'.

FIG. 1A shows a 3D ferroelectric memory device 10 according to an embodiment, in particular in a cross section (side view). FIG. 1B shows a further cross-section (top view) of the 3D ferroelectric memory device 10 illustrated in FIG. 1A, particularly along the section A-A'. The 3D ferroelectric memory device 10 may be of the NAND-type.

The memory device 10 comprises a stack, which stack comprises a plurality of gate electrode layers 12 and spacer layers 11. These gate electrode layers 12 and spacer layers 11 are alternatingly arranged along a first direction. Here in FIG. 1A, they are exemplarily arranged vertically, e.g., one above the other. The plurality of gate electrode layers 12 may be substantially identical. The plurality of spacer layers 11 may be substantially identical. The memory device 10 may, of course, include more gate electrode layers 12 and spacer layers 10 than are shown in FIG. 1A, and it is only exemplary that a spacer layer 11 shown as the top-most layer and bottom-most layer of the stack. The gate electrode layers 12 may each comprise a metal including, e.g., at least one of the following materials: Cu, Al, Ti, W, Ni, Au, TiN, TaN, TaC, NbN, RuTa, Co, Ta, Mo, Pd, Pt, Ru, Jr, and Ag. The spacer layers 11 may each comprise a dielectric material, e.g., at least one of the following materials: $SiO_2$, SiO, SiN, SiON, $Al_2O_3$, AlN, MgO, and carbides.

Further, the memory device 10 comprises a semiconductor channel 13 extending in and/or through the stack. Here, in FIG. 1A, the semiconductor channel 13 extends vertically, or along the first direction, through the stack. Accordingly, the channel 13 passes sequentially through all of the alternatingly arranged gate electrode layers 12 and spacer layers 11, respectively. As shown in FIG. 1B, the semiconductor channel 13 may have a circular diameter, and may be surrounded by the gate electrode layers 12 and spacer layers 11 (not shown), respectively. Notably, FIG. 1B shows a cut through the cross-section A-A' as shown in FIG. 1A. However, the gate electrode layers 12 and spacer layers 11 may of course surround completely the channel 13 (e.g., they may have a full-circle shape in a top down view). The semiconductor channel 13 may comprise a semiconductor material, e.g., at least one of the following materials: Si, SiGe, Ge, GaAs, GaAsP, InAs, InSb, and InP.

Further, the memory device 10 comprises a ferroelectric layer 14, which is arranged between the gate electrode layers 12 and the semiconductor channel 13. In particular, as shown in FIG. 1B, the ferroelectric layer 14 may surround the channel 13, and may itself be surrounded by the gate electrode layers 12 and spacer layers 11 (not shown). The ferroelectric layer 13 may comprise a ferroelectric material, e.g., at least one of the following materials: $HfO_2$ (which may be doped or alloyed with Si, Y, Gd, La, Zr, or Al). Alloyed $HfO_2$ may be represented as HfXO, where X is an alloying element, e.g., $HfZrO_4$, where Z is the alloying element. Doped HfO2 may be represented as $XHfO_2$, where X is a dopant, e.g., $Y{:}HfO_2$, $Sr{:}HfO_2$, $La{:}HfO_2$, $Al{:}HfO_2$, and $Gd{:}HfO_2$, where Y, Sr, La, Al and Gd are dopants.

The gate electrode layers 12 form, in combination with the semiconductor channel 13 and the ferroelectric layer 14, a string of ferroelectric transistors 15. The ferroelectric transistors 15 may be connected in series along, for example, the first or vertical direction. Each ferroelectric transistor 15 may be associated with or included as part of one memory cell of the memory device 10, e.g., it may be used store one bit during operation of the memory device 10. In configurations where the channel 13, the ferroelectric layer 14, and the gate electrode layers 12 are arranged as shown in FIG. 1B, a gate-all-around (GAA) vertical channel structure may be obtained, wherein the ferroelectric layer 14 is wrapped completely around the channel 13, which may have a shape of an elongated cylinder or a rod extending in the vertical or first direction, and the gate electrode layers 12 are wrapped completely around the ferroelectric layer 14 and the channel 13 (and the spacer layers 11 may also be wrapped completely around the ferroelectric layer 14 and the channel 13). In the illustrated embodiment, the ferroelectric layer 14 forms a concentric shell around the channel 13 having an elongated cylinder or a rod shape. In this case, one bit may be stored in the string of ferroelectric transistors 15 per each initially formed gate electrode layer 12.

The first ferroelectric transistor 15$f$ in the string of ferroelectric transistors 15—here in FIG. 1A it is exemplarily the top-most ferroelectric transistor 15—and the last ferroelectric transistor 15$l$ in the string of ferroelectric transistors 15—here in FIG. 1A it is exemplarily the bottom-most ferroelectric transistor 15—have a lower threshold voltage than the other ferroelectric transistors 15, i.e., have a lower threshold voltage than the ferroelectric transistors 15 arranged in between them.

Figure 2:
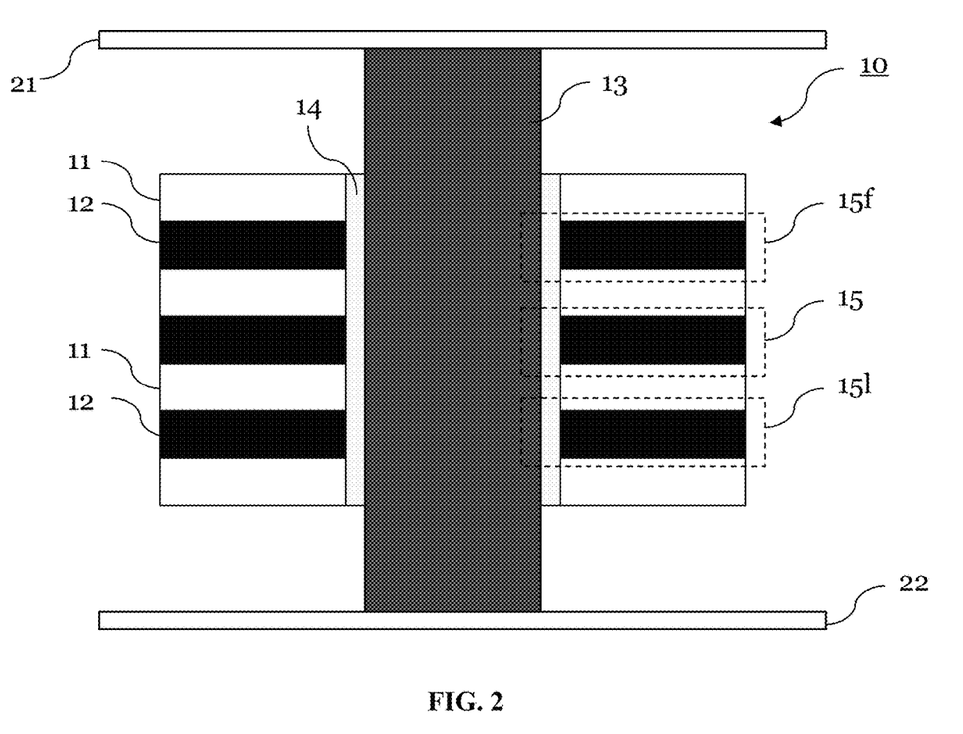
FIG. 2 is a cross-sectional side view of a 3D ferroelectric memory device having a straight channel and including a bit-line and a source-line, according to embodiments.

FIG. 2 shows the 3D ferroelectric memory device 10 according to an embodiment of the invention, which builds on the embodiment of FIG. 1. Same elements in FIG. 1A, FIG. 1B and FIG. 2 are labelled with the same reference signs and function likewise. The embodiment of the memory device 10 of FIG. 2 is shown with further, optional details compared to FIG. 1.

In particular, the 3D ferroelectric memory device 10 of FIG. 2 comprises a bit-line 21 and a source-line 22. The bit-line 21 (also referred to as drain-line) and the source-line 22 of the memory device 10 are directly connected to, respectively, the first ferroelectric transistor 15$f$ and the last ferroelectric transistor 15$l$. Specifically, the bit-line 21 and the source-line 22 are connected to the channel 13, e.g., directly connected to the channel 13, which means that they are connected without any additional structure or selectors arranged in between. For example, the bit-line 21 may be connected to the first ferroelectric transistor 15$f$, and the source-line 22 may be connected to the last ferroelectric transistor 15$l$, or vice versa. For example, the bit-line 21 may be arranged above the stack and the channel 13, respectively, such that the first ferroelectric transistor 15$f$ is a top-most ferroelectric transistor 15 in the string of ferroelectric transistors 15. Further, the bit-line 22 may be arranged below the stack and the channel 13, respectively, so that the last ferroelectric transistor 15$l$ is a bottom-most ferroelectric transistor 15 in the string of ferroelectric transistors 15. In particular, the 3D ferroelectric memory device 10 may comprise the bit-line 21 and the source-line 22, arranged on opposite sides of the stack (considering the first direction).

The first ferroelectric transistor 15f may thus function as a bit-line 21 selector during the operation of the memory device 10. The last ferroelectric transistor 15l may function as a source-line 22 selector during the operation of the memory device 10. This may also be vice versa.

Figure 3A:
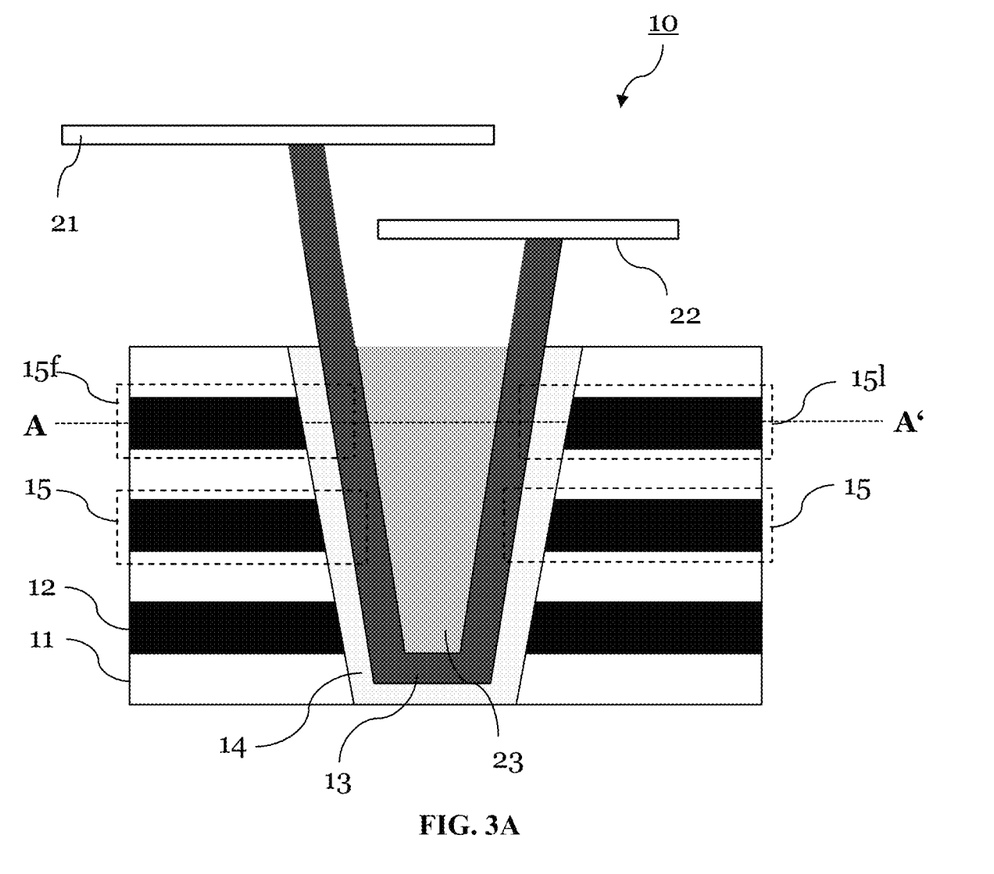
FIG. 3A is a cross-sectional side view of a 3D ferroelectric memory device having a U-shaped channel, according to embodiments.
Figure 3B:
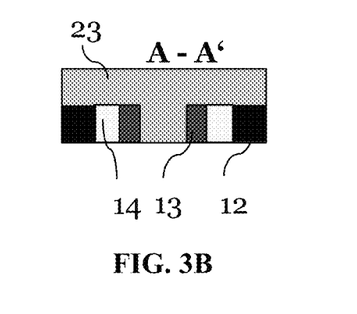
FIG. 3B shows a top view of the 3D ferroelectric memory device shown in FIG. 3A at a cross-section through A-A'.

FIG. 3A shows a 3D ferroelectric memory device 10 according to an embodiment of the invention, in particular in a cross-section (side view), wherein the embodiment builds on the embodiments of FIGS. 1A/1B and FIG. 2. FIG. 3B shows a further cross-section (top view) of the cross-section shown in FIG. 3(a), particularly through the section A-A'. Same elements in FIGS. 1A/1B, FIG. 2, and FIGS. 3A/3B are labelled with the same reference signs and function likewise. Also the above-mentioned materials may be the same in FIGS. 3A/3B.

The memory device 10 in the embodiment of FIGS. 3A/3B has a different architecture than the memory device 10 shown in the embodiments of FIGS. 1A/1B and FIG. 2. In particular, as shown in FIG. 3A, the ferroelectric memory device 10 has a so-called pipeline architecture. The memory device 10 comprises a source-line 22 and a bit-line 21, which are both arranged on the same side of the stack (considering the first direction). In FIG. 3A, as an example, both the bit-line 21 and the source-line 22 are arranged above the stack and the channel 13, respectively.

Further, the channel 13 extends in the stack and has a U-shape. This may be realized by first processing a full channel (as it is shown in FIG. 1A and FIG. 2), and then separating this full channel into the two branches of the U-shaped channel 13, in particular by providing a dielectric filling material 23 between the branches. The dielectric filling material 23 may comprise at least one of the following materials: $Al_2O_3$, $SiO_2$, SiN, low-k material, air, and vacuum. As can be seen in FIG. 3B, the dielectric filling material 23, in this case, also separates each of the plurality of gate electrode layers 12 into two separate parts on the opposite sides (left and right in FIG. 3A) of the channel 13 (notably, the same may be true for the spacer layers 11, not shown). Thus, two ferroelectric transistors 15 are formed based on each gate electrode layer 12, wherein the two ferroelectric transistors 15 are arranged on the opposite sides, across, the dielectric filling material 23 and channel branches, respectively. That is, each gate electrode layer 12 forms, together with the channel 13 and the ferroelectric layer 14, two ferroelectric transistors 15. The ferroelectric transistors 15 formed by the gate electrode layers 12 form the string of ferroelectric transistors 15. Since each ferroelectric transistor 15 is associated with a memory cell, and may be used to store one bit, two bits may be stored per each initially fabricated gate electrode layer 12.

As shown in FIG. 3A, in this embodiment, the string of ferroelectric transistors 15 is formed such that it follows the U-shape of the semiconductor channel 13. Therefore, the first ferroelectric transistor 15f may be a top-most ferroelectric transistor 15 arranged on the one (e.g., left) side of the channel 13, and the last ferroelectric transistor 15l may be a top-most ferroelectric transistor 15 arranged on the other (e.g., right) side of the channel 13, or vice versa. The first ferroelectric transistor 15f and the second ferroelectric transistor 15l may again be conditioned, as described above with respect to FIGS. 1A/1B and FIG. 2, in order to have a threshold voltage that is lower than the threshold voltage of the other ferroelectric transistors 15.

The 3D ferroelectric memory device 10, according to any one of the embodiments of the invention shown in FIGS. 1A/1B, 2 and 3A/3B, may be obtained in different ways. An already processed 3D ferroelectric memory device may be taken and may be properly conditioned, e.g., in a test mode or test pattern, in order to obtain the 3D ferroelectric memory device 10. Alternatively, a full fabrication method 40 (see, e.g., FIG. 4) may be performed, in order to obtain the 3D ferroelectric memory device 10.

In particular, for the first option, a 3D ferroelectric memory device with most of the structural features of the final ferroelectric memory device 10 may have been pre-fabricated, however, with all the ferroelectric transistors 15 in the string of ferroelectric transistors 15 (including the first ferroelectric transistor 15f and the last ferroelectric transistor 15l) having the same threshold voltage. This pre-fabricated 3D ferroelectric memory device may then be subjected to a conditioning/programming method. In particular, the first ferroelectric transistor 15f and the last ferroelectric transistor 15l in the string of ferroelectric transistors 15 may, respectively, be conditioned/programmed, in order to decrease their respective threshold voltages. For instance, a positive voltage can be applied to their respective gate electrode layers 12 (or their respective parts of gate electrode layers 12, e.g., in FIGS. 3A/3B), for instance, during the test mode or test pattern. That means, in particular, the conditioning may be done before a packaging of the final 3D ferroelectric memory device 10. The threshold voltages of the first and the last ferroelectric transistor 15f and 15l may specifically be set to the same value or to different values.

Figure 4:
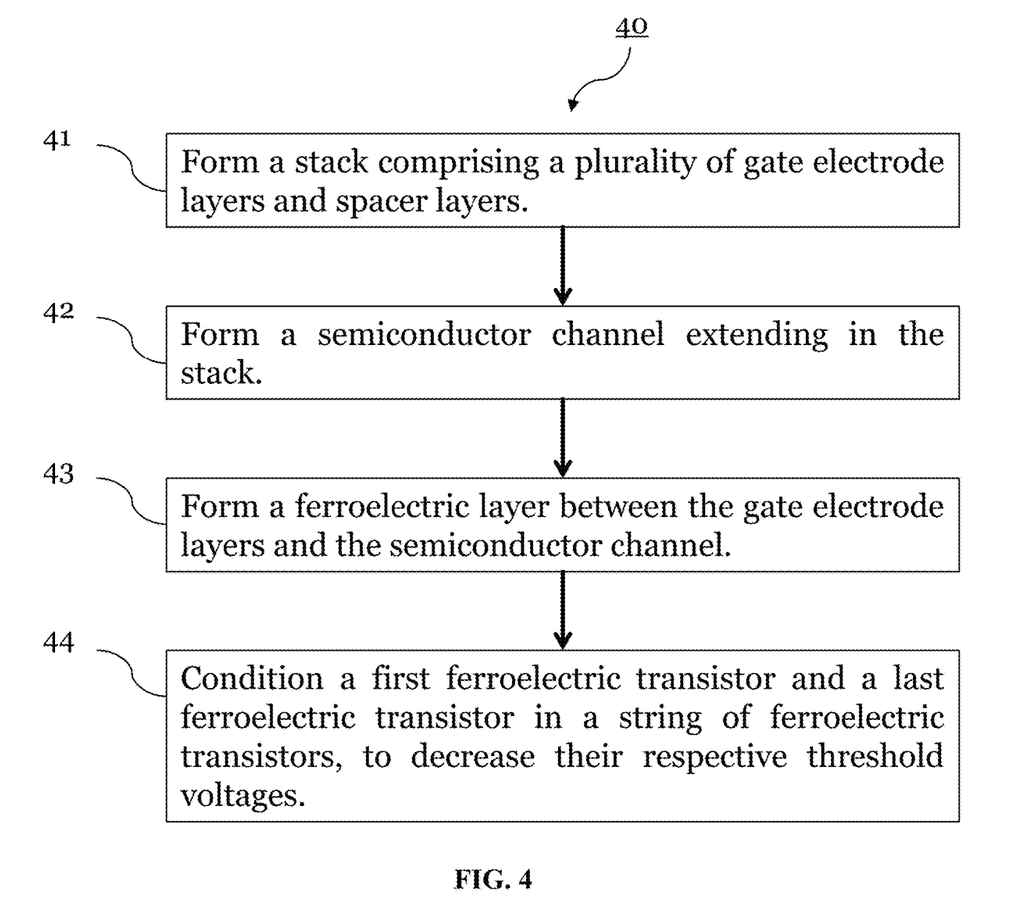
FIG. 4 shows a method of fabricating a 3D ferroelectric memory device, according to embodiments.

For the second option, FIG. 4 shows a method according to an embodiment. The method 40 may comprise the following steps as also illustrated in FIG. 4.

In step 41 of the method 40, a stack comprising a plurality of gate electrode layers 12 and spacer layers 11 is fabricated, which are alternatingly arranged one on the other along a first direction. The plurality of gate electrode layers 12 and spacer layers 11 may all be fabricated in the same process. The stack may be fabricated using at least one of the following techniques: atomic layer deposition (ALD), physical vapor deposition (PVD), chemical vapor phase deposition (CVD), low pressure CVD (LPCVD), and plasma enhanced CVD (PECVD).

In a step 42, a semiconductor channel 13 is formed to extend in or through the stack. The semiconductor channel 13 may extend straight through the stack, for example, along the first direction (as shown in FIG. 1A and FIG. 2). As shown in FIGS. 1A and 1B, the semiconductor channel 13 having an elongated rod shape may be formed by filling an opening or a hole formed by etching through the stack of alternating electrode and spacer layer with a semiconductor material. The sidewalls of the opening may be lined with the ferroelectric layer 14 prior to filling the opening with the semiconductor material. Alternatively, the semiconductor channel 13 may extend in or through the stack following some other shape, for instance, a U-shape (as shown in FIG. 3A). In this configuration, the channel 13 may be formed by creating, e.g. by etching, an opening into the stack, and then depositing channel material 13, and optionally a dielectric filling material 23, into the opening. The sidewalls of the opening may be lined with the ferroelectric layer 14 prior to filling the hole.

In a step 43, a ferroelectric layer 14 is formed between the gate electrode layers 12 and the semiconductor channel 13. Thereby, the ferroelectric layer 14 may be formed before forming the semiconductor channel 13 or afterwards. For instance, the ferroelectric layer 14 may be deposited into the above-mentioned (etched) opening, before depositing the channel material 13.

In fabricating the embodiment illustrated in FIG. 2, forming the semiconductor channel 13 comprises forming an opening through the stack comprising the plurality of gate electrode layers 12 and spacer layers 11, lining sidewalls of the opening with the ferroelectric layer 14 and filling the opening with a semiconductor material. Notably, in this embodiment, one end of the semiconductor channel 13 is connected to the bit line 21 and an opposite end of the semiconductor channel 13 is connected to the a source line 22, wherein the bit line 21 and the source line 22 are disposed on opposite sides of the stack comprising the plurality of gate electrode layers 12 and spacer layers 11.

In fabricating the embodiment illustrated in FIGS. 3A/3B, forming the semiconductor channel 13 comprises forming an opening through the stack comprising the plurality of gate electrode layers 12 and spacer layers 11, lining sidewalls and a bottom surface of the opening with the ferroelectric layer 14 and depositing a semiconductor material on the ferroelectric layer 14 to form a U-shaped channel. Notably, in this embodiment, one end of the U-shaped channel is connected to the bit line 21 and the other end of the U-shaped channel is connected to a source line 22, wherein the bit line 21 and the source line 22 are disposed on the same side of the stack comprising the plurality of gate electrode layers 12 and spacer layers 11.

Notably, the ferroelectric layer 14 and the semiconductor channel 13 may be fabricated in the same process, e.g., with respect to each gate electrode layer 12 and spacer layer 11. In particular, the channel 13 and ferroelectric layer may be processed for all gate electrode layers 12 and spacer layers 11 at once. The gate electrode layers 12 form, together with the channel 13 and the ferroelectric layer 14, a string of ferroelectric transistors 15. Each ferroelectric transistor 15 may thus be fabricated in the same process and/or with the same gate stack. Each ferroelectric transistor 15 is associated with one cell of the 3D ferroelectric memory device.

As a final step 44 of the method 40, the first ferroelectric transistor 15f and the last ferroelectric transistor 15l in the string of ferroelectric transistors 15 are conditioned, for instance, by respectively applying a positive voltage to their associated gate electrode layers 12, so that their respective threshold voltages decrease. The conditioning may be performed post-fabrication and prior to use. Thereby, the same positive voltage may be applied to both ferroelectric transistors 15f and 15l, but also individually selected voltages may be applied to the first ferroelectric transistor 15f and the last ferroelectric transistor 15l, respectively. In particular, the threshold voltages of the first and last ferroelectric transistor 15f and 15l may be, respectively, set to a value that guarantees the on-state during operation of the memory device 10.

For both options, in the final 3D ferroelectric memory device 10, the first ferroelectric transistor 15f may be configured to be a bit-line selector during operation of the memory device 10 and/or the last ferroelectric transistor 15l may be configured to be a source-line 22 selector during operation of the memory device 10, or vice versa.

In summary, a 3D ferroelectric memory device 10 is achieved by the embodiments of the invention. The memory device 10 provides the advantage that it does not require any extra selector(s) for selecting a string (one of multiple strings) of memory cells. Accordingly, the memory cells and the selectors (i.e. the conditioned selector cells associated with the first and last ferroelectric transistor 15f and 15l, respectively) can be fabricated in the same process, which means a significant reduction of process complexity. Furthermore a more compact memory device 10 becomes possible. The ferroelectric memory device 10 according to embodiments of the invention may be suitable to replace Flash or storage class memory (SCM).

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number, respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The various features and processes described above may be implemented independently of one another, or may be combined in various ways. All possible combinations and subcombinations of features of this disclosure are intended to fall within the scope of this disclosure.

What is claimed is:

1. A method of fabricating a three-dimensional (3D) ferroelectric memory device, the method comprising:
    forming a stack comprising a plurality of gate electrode layers and spacer layers alternating along a first direction;
    forming a semiconductor channel extending through the stack;

forming a ferroelectric layer between the gate electrode layers and the semiconductor channel, wherein the gate electrode layers form, in combination with the semiconductor channel and the ferroelectric layer, a string of ferroelectric transistors, wherein each of the ferroelectric transistors is associated with one cell of the 3D ferroelectric memory device; and conditioning a first ferroelectric transistor and a last ferroelectric transistor of the string to decrease respective threshold voltages thereof.

2. The method according to claim 1, wherein conditioning the first and last ferroelectric transistors comprises applying a positive voltage to respective gate electrode layers.

3. The method according to claim 1, wherein the ferroelectric transistors are formed by the same fabrication process.

4. The method according to claim 1, wherein prior to conditioning the first and last ferroelectric transistors, all the ferroelectric transistors have the substantially the same threshold voltage.

5. The method according to claim 1, wherein conditioning the first and last ferroelectric transistors is performed by applying a test mode or test pattern.

6. The method according to claim 1, wherein conditioning the first and last ferroelectric transistors comprises decreasing respective threshold voltages thereof to a value such that the first and last ferroelectric transistors are in an on-state during operation of the 3D ferroelectric memory device.

7. The method according to claim 1, wherein conditioning the first and last ferroelectric transistors comprises setting threshold voltages thereof to a common value.

8. The method according to claim 1, wherein conditioning the first and last ferroelectric transistors comprises setting threshold voltages thereof to different values.

9. The method according to claim 1, wherein forming the semiconductor channel comprises forming an opening through the stack comprising the plurality of gate electrode layers and spacer layers, lining sidewalls of the opening with the ferroelectric layer and filling the opening with a semiconductor material.

10. The method according to claim 9, further comprising connecting one end of the semiconductor channel to a bit line and connecting an opposite end of the semiconductor channel to a source line, wherein the bit line and the source line are disposed on opposite sides of the stack comprising the plurality of gate electrode layers and spacer layers.

11. The method according to claim 1, wherein forming the semiconductor channel comprises forming an opening through the stack comprising the plurality of gate electrode layers and spacer layers, lining sidewalls and a bottom surface of the opening with the ferroelectric layer and depositing a semiconductor material on the ferroelectric layer to form a U-shaped channel.

12. The method according to claim 11, further comprising connecting one end of the U-shaped channel to a bit line and connecting the other end of the U-shaped channel to a source line, wherein the bit line and the source line are disposed on the same side of the stack comprising the plurality of gate electrode layers and spacer layers.

13. The method according to claim 1, wherein the ferroelectric layer comprises $HfO_2$.

14. A three-dimensional (3D) ferroelectric memory device, comprising:

a stack comprising a plurality of gate electrode layers and spacer layers alternatingly arranged along a first direction;

a semiconductor channel extending through the stack; and a ferroelectric layer arranged between the gate electrode layers and the semiconductor channel, wherein the gate electrode layers form, in combination with the semiconductor channel and the ferroelectric layer, a string of ferroelectric transistors, wherein each of the ferroelectric transistors is associated with one cell of the 3D ferroelectric memory device, and wherein a first ferroelectric transistor and a last ferroelectric transistor in the string have lower threshold voltages than other ferroelectric transistors in the string.

15. The 3D ferroelectric memory device according to claim 14, wherein a bit-line and a source-line of the 3D ferroelectric memory device are directly connected to, respectively, the first ferroelectric transistor and the last ferroelectric transistor.

16. The 3D ferroelectric memory device according to claim 14, wherein the first ferroelectric transistor is configured to be a bit-line selector during operation of the 3D ferroelectric memory device, and/or wherein the last ferroelectric transistor is configured to be a source-line selector during operation of the 3D ferroelectric memory device.

17. The 3D ferroelectric memory device according to claim 14, wherein the first ferroelectric transistor and the last ferroelectric transistor are configured to be in an on-state during operation of the 3D ferroelectric memory device.

18. The 3D ferroelectric memory device according to claim 14, wherein the semiconductor channel is arranged as a macaroni channel shape filled with a dielectric material and surrounded by the ferroelectric layer.

19. The 3D ferroelectric memory device according claim 14, wherein the ferroelectric transistors are connected in series to form a memory cell NAND string.

20. A method of conditioning a three-dimensional (3D) ferroelectric memory device, comprising:

providing the memory device, comprising:

a stack comprising a plurality of gate electrode layers and spacer layers alternatingly arranged along a first direction;

a semiconductor channel extending through the stack; and a ferroelectric layer arranged between the gate electrode layers and the semiconductor channel, wherein the gate electrode layers form, in combination with the semiconductor channel and the ferroelectric layer, a string of ferroelectric transistors, wherein each of the ferroelectric transistors is associated with one cell of the 3D ferroelectric memory device, and wherein each of the ferroelectric transistors has about the same threshold voltage; and conditioning a first ferroelectric transistor and a last ferroelectric transistor in the string to decrease respective threshold voltages thereof.

* * * * *